(12) United States Patent
Seki (10) Patent No.: US 6,426,645 B1
(45) Date of Patent: Jul. 30, 2002

(54) SEMICONDUCTOR DEVICE THAT FIXES A POTENTIAL ON AN INPUT SIGNAL WIRING

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/480,709

(22) Filed: Jan. 7, 2000

(30) Foreign Application Priority Data

Jan. 8, 1999 (JP) .......................................... 11-002909
Oct. 15, 1999 (JP) .......................................... 11-293687

(51) Int. Cl.[7] .............................................. H03K 19/00
(52) U.S. Cl. ........................................ 326/16; 326/101
(58) Field of Search .......................... 326/16, 101–103, 326/37–39, 47, 27

(56) References Cited

U.S. PATENT DOCUMENTS 5,671,234 A * 9/1997 Phillips et al. .............. 714/726
6,157,207 A * 12/2000 Eaton et al. .................. 326/38

FOREIGN PATENT DOCUMENTS

| JP | 60-065625 | 4/1985 |
| JP | 03-240235 | 10/1991 |
| JP | 07-176618 | 7/1995 |
| JP | 407176618 A | * 7/1995 |

* cited by examiner

*Primary Examiner*—Michael Tokar
*Assistant Examiner*—James H Cho
(74) *Attorney, Agent, or Firm*—Hogan & Hartson, L.L.P.

(57) ABSTRACT

A semiconductor device defines a peripheral circuit region and a central circuit region. The peripheral circuit region includes a control signal wiring extending through the peripheral circuit region, a first cell having a test terminal connecting to the control signal wiring, N number of second cells that input and/or output signals, each having a signal terminal, and a plurality of third cells, each having a power source terminal. Among N number of the second cells, n (n<N) number of the second cells have input signal wirings coupled to the signal terminals, and potential fixing circuits that fix the potential on the input signal wirings. Each of the potential fixing circuits has one of a plurality of control terminals. A plurality of serially connected buffers are coupled to the control signal wiring. The control signal wiring connects to the control terminals of the potential fixing circuits, wherein the control terminals are provided with a logic that turns on the potential fixing circuits during normal operation, and when a signal is inputted in the test terminal, the potential fixing circuits turn off. The plurality of serially connected buffers are disposed in the plurality of the third cells, but not disposed in N number of the second cells.

8 Claims, 10 Drawing Sheets

SEMICONDUCTOR DEVICE THAT FIXES A POTENTIAL ON AN INPUT SIGNAL WIRING

BACKGROUND OF THE INVENTION

1. Field of the Invention

The present invention relates to a semiconductor device that fixes a potential on an input signal wiring, that is connected to either an input terminal or an input/output terminal, by a pull-up or a pull-down.

2. Description of Related Art

As the number of pins increases, semiconductor devices of the type described above do not retain an input signal wiring, that is connected to an input terminal or an input/output terminal, in a floating state, but fix it at a potential "H" by a pull-up or at a potential "L" by a pull-down. This is because, unless potentials on all input signal wirings are controlled immediately after the power is turned on, the potentials do not stabilize if the input signal wirings are in a floating state, and the control therefor is very complex when many pins are present.

Before shipping out semiconductor devices, a semiconductor manufacturer must conduct input leak tests to measure whether potentials on the input signal wirings, that are connected to input terminals or input/output terminals, leak to the power source voltage VDD side or to the ground voltage VSS side.

A proposed technology that enables the input leak test is described in Japanese Laid-open Patent Application HEI 4-213849. Prior art technology 1 described in the publication will be described below with reference to FIG. 7.

Figure 7:
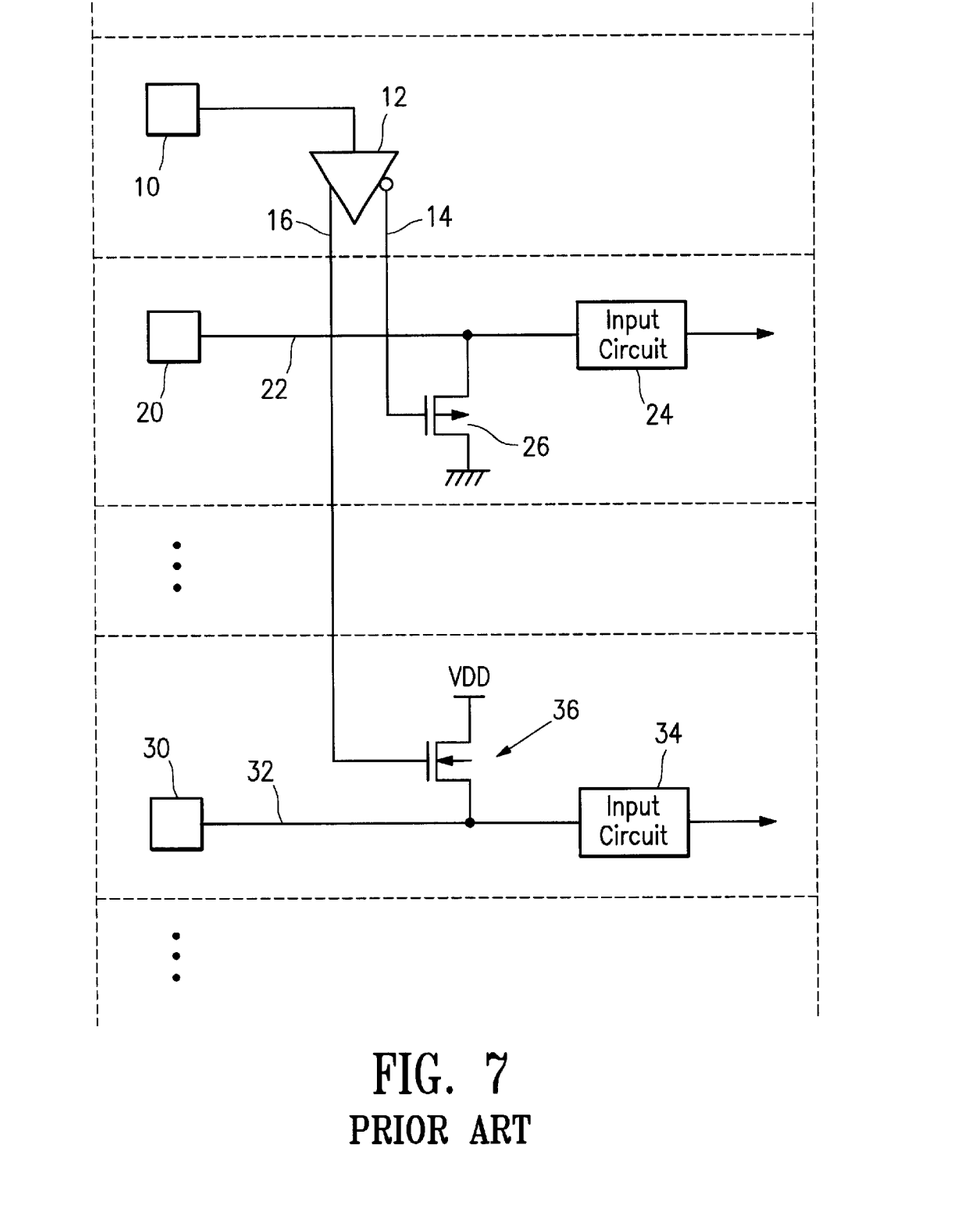
FIG. 7 is a circuit diagram in part of a peripheral circuit region of a semiconductor device of first prior art.

Referring to FIG. 7, a semiconductor device includes a test terminal 10 and a plurality of input terminals 20, 30. The test terminal 10 connects to a control circuit 12. The control circuits 12 has output wirings that define an inversion signal wiring 14 and a non-inversion signal wiring 16.

The input terminals 20 and 30 are connected through input signal wirings 22 and 32 to input circuits 24 and 34, respectively. The input signal wiring 22 is grounded through a pull-down MIS (metal-insulation-silicon) transistor, for example, a N-type MOS (metal-oxide-silicon) transistor 26. The transistor 26 has a gate that is connected to the inversion signal wiring 14. Power source voltage VDD is applied to the input signal wiring 32 through a pull-up MIS transistor, for example a P-type MOS transistor 36. The transistor 36 has a gate that is connected to the non-inversion signal wiring 16.

Therefore, during normal operation, when a signal at level "L" is applied to the test terminal 10, the inversion signal wiring 14 of the control circuit 12 attains logic level "H", the N-type MOS transistor 26 turns on, and the input signal wiring 22 has a potential fixed at level "L". On the other hand, the non-inversion signal wiring 16 of the control circuit 12 attains logic level "L", the P-type MOS transistor 36 turns on, and the input signal wiring 32 has a potential fixed at level "H".

During an input leak test, a signal at a potential level "H" is applied to the test terminal 10. As a result, the inversion signal wiring 14 of the control circuit 12 attains logic level "L", the N-type MOS transistor 26 turns off, and the input signal wiring 22 is placed in a floating state. On the other hand, the non-inversion signal wiring 16 of the control circuit 12 attains logic level "H", the P-type MOS transistor 36 turns off, and the input signal wiring 32 is also placed in a floating state. In this manner, when the input signal wirings 22 and 32 are placed in a floating state, the input leak test can be correctly conducted. If a current flows during the test, it is determined that the tested semiconductor device is defective.

Figure 8:
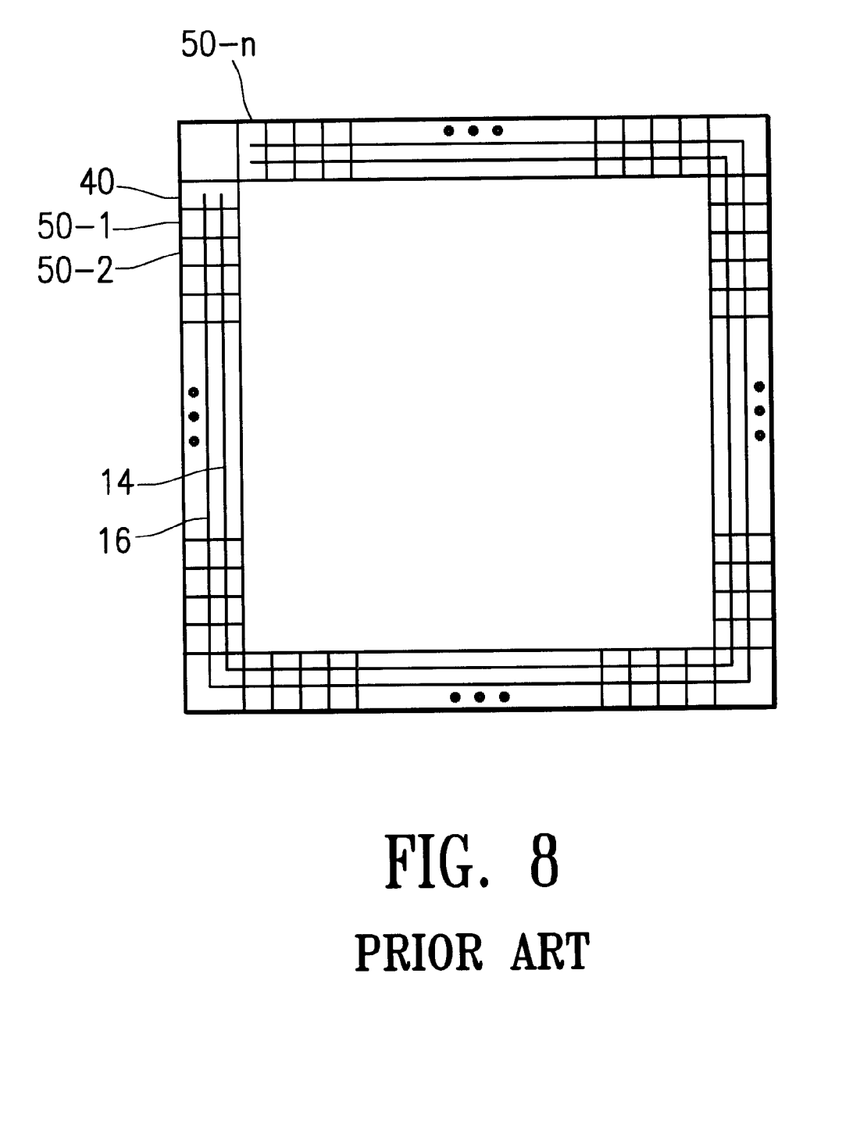
FIG. 8 is a plan view of the entire semiconductor device of the first prior art shown in FIG. 7.

FIG. 8 shows a semiconductor device in which the structure shown in FIG. 7 is applied. A test cell 40 shown in FIG. 8 corresponds to the test terminal 10 of FIG. 7.

As shown in FIG. 8, a total of n number of above-described input cells or input/output cells 50-1, 50-2, . . . 50-n having input terminals 20, 30 or input/output terminals are disposed in a peripheral circuit region extending along four edges of the semiconductor device. Accordingly, the inversion signal wirings 14 and the non-inversion signal wirings 16 connected to the test cells 40 need to be formed along generally the entire circumference of the peripheral circuit region of the semiconductor device.

However, the wiring capacitance of the inversion and non-inversion signal wirings 14 and 16 that extend such a long distance reaches several tens pF. Also, the gate capacitance of each of the pull-down or pull-up transistors 26, 36 is several tens fF. However, when a large number of these transistors are present, their total gate capacitance reaches several tens pF. As a consequence, the control circuit 12 shown in FIG. 7 needs to be composed of circuits having a large capacitance. Therefore, the control circuit 12 having the large capacitance occupies a large area. Moreover, the wiring capacitance of the inversion and non-inversion signal wirings 14, 16 and the total gate capacitance of the pull-down and pull-up transistors greatly depend on the size of a chip. Accordingly, the capacitance of the control circuit 12 is required to be determined depending on the size of a chip, which is inconvenient.

When the inversion and non-inversion signal wirings 14, 16 have a large wiring capacitance, problems of signal delays cannot be ignored. This is because, in recent years, the time for an input leak test is controlled in units of sub-seconds, and a higher operation speed is required.

Also, when the inversion and non-inversion signal wirings 14, 16 have a large wiring capacitance, the waveform of the control signal becomes blunt. This makes it difficult to design circuits to provide logic signals to turn on or turn off the gates of the pull-down or pull-up transistors 26, 36 that are located far from the control circuit 12.

The inventor of the present application proposed an improved technology in Japanese Laid-open patent application HEI 7-176618 to solve the above-described prior art problems.

Figure 9:
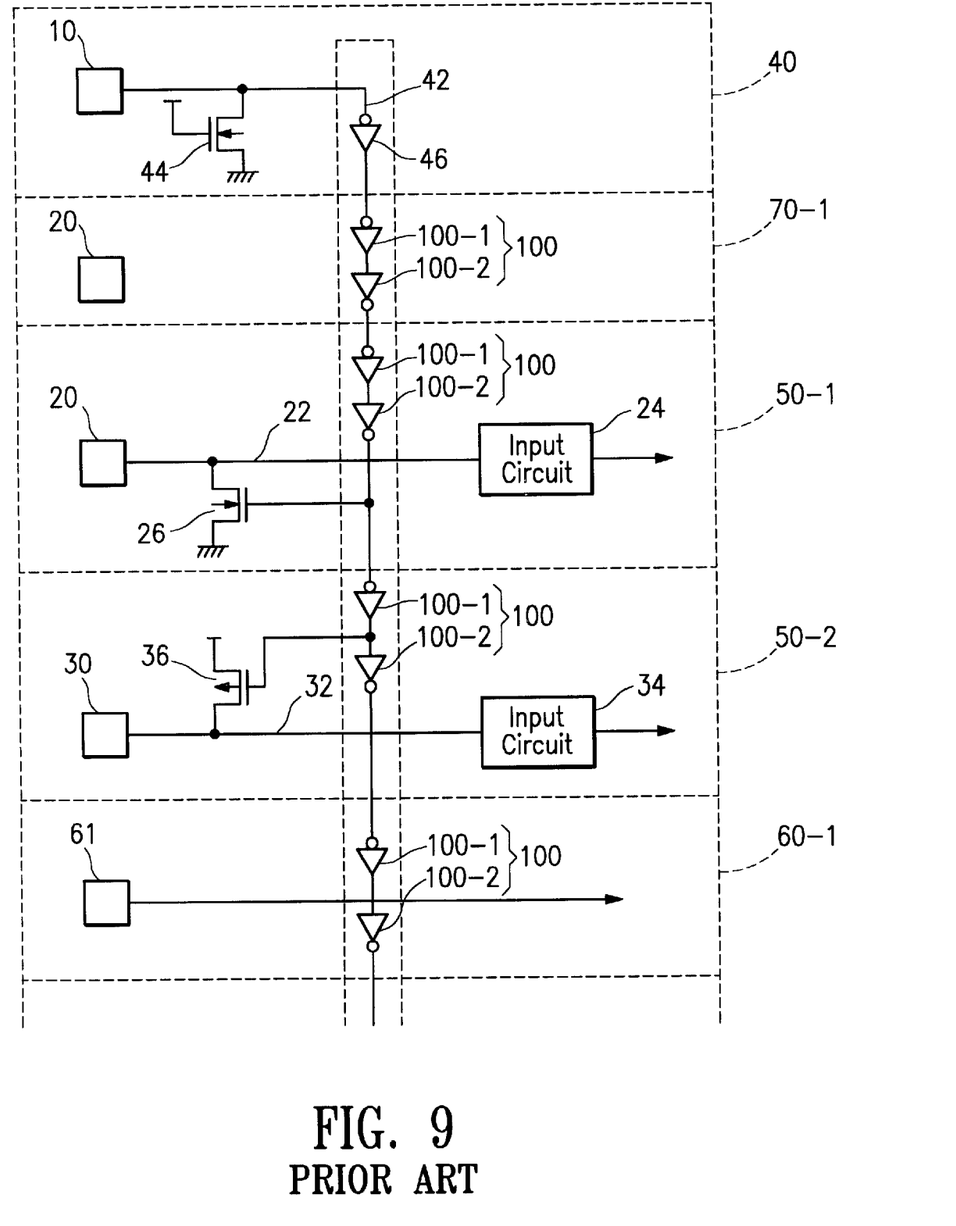
FIG. 9 is a circuit diagram in part of a peripheral circuit region of a semiconductor device of second prior art.
Figure 10:
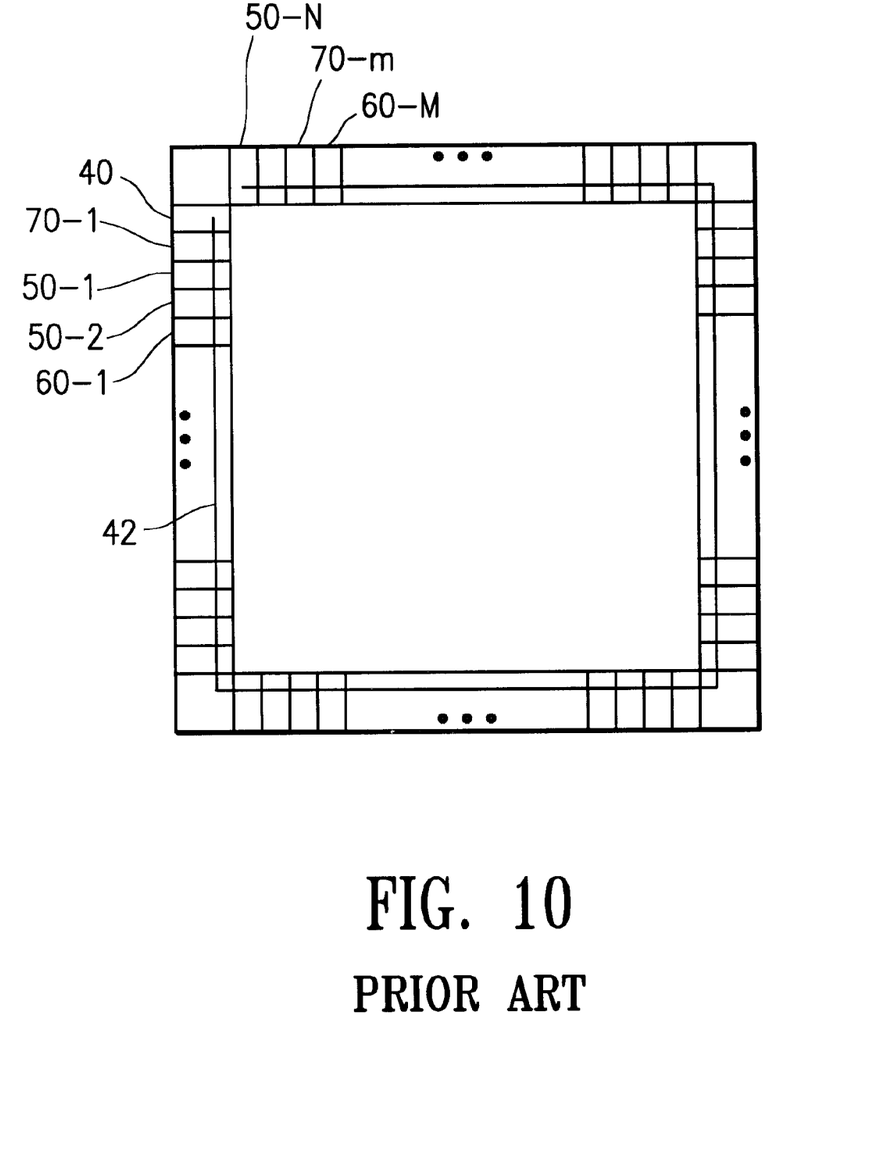
FIG. 10 is a plan view of the entire semiconductor device of the second prior art shown in FIG. 9.

FIG. 9 shows the technology disclosed the above-described publication. Referring to FIG. 9, a test cell 40 includes a test terminal 10, a control signal wiring 42 connected to the test terminal 10, an N-type MOS transistor 44 that always maintains the potential on the control signal wiring 42 at level "L", and an inverter 46 provided in the control signal wiring 42. The control signal wiring 42 is formed along generally the entire circumference of the peripheral circuit region of the semiconductor device, as shown in FIG. 10.

FIG. 9 also shows two input cells 50-1 and 50-2 that have substantially the same structure of those shown in FIG. 7. Each of the two input cells 50-1 and 50-2 has a buffer 100 provided in the control signal wiring 42. Each of the buffer 100 is formed from two serially connected inverters 100-1 and 100-2.

The input cell 50-1 has a pull-down N-type MOS transistor 26. A control signal buffered by the buffer 100 is inputted in a gate of the N-type MOS transistor 26. On the other hand, the input cell 50-2 has a pull-up P-type MOS transistor 36. A signal between the two inverters 100-1 and 100-2 that compose the buffer 100 is supplied to a gate of the P-type MOS transistor 36.

By the structure described above, during normal operation when the potential of the test terminal 10 is at "L" level, both of the N-type and P-type MOS transistors 26 and 36 are turned on, and the potential on each of the input signal wirings 22 and 32 is fixed. During input leak test when the potential of the test terminal 10 is at "H" level, both of the N-type and P-type MOS transistors 26 and 36 are turned off, and each of the input signal wirings 22 and 32 is set in a floating state.

As shown in FIG. 10, the peripheral circuit region of the semiconductor device is also provided with a variety of cells other than the above-described test cells 40, the input cells or input/output cells 50-1 through 50-n having input terminals or input/output terminals. The input/output cells 50-1 through 50-N (N>n) shown in FIG. 10 generally refer to output cells having output terminals in addition to input cells or input/output cells having input terminals or input/output terminals. The peripheral circuit region is also provided with power source cells 60-1 through 60-M having power source voltage (VDD) terminals 61 or ground voltage (VSS) terminals 62. FIG. 10 also shows non-connected cells 70-1 through 70-m, which are characteristic for a master slice type semiconductor device. The non-connected cells include input terminals, input/output terminals or output terminals that are not connected to transistors provided in these cells.

The buffer 100 shown in FIG. 9 is disposed in each of the input/output cells 50-1 through 50-N, the power source cells 60-1 through 60-M and the non-connected cells 70-1 through 70-m.

According to the second prior art, even when the wiring capacitance of the control signal wiring 42 is large, the wiring capacitance is divided and distributed to and born by the numerous buffers 100 that are provided in the control signal wiring 42. In other words, the large wiring capacitance of the control signal wiring 42 is divided by the total number of the buffers 100, and born by the buffers 100. Accordingly, the capacity of each of the buffers 100 can be made relatively small. Also, the dependence of the capacitance of the buffer 100 on the chip size is greatly reduced. Moreover, because the numerous buffers 100 are disposed in the control signal wiring 42 and the control signal waveform is rectified by each of the buffers 100, the level of blunting of control signals to be provided to the gates of the N-type and P-type MOS transistors 26, 36 is reduced.

The second prior art technology described above has many more advantages over the first prior art technology. However, since there are a vast number of the buffers 100, a substantially large area is required exclusively for the buffers 100. Also, there occurs another problem in that a control signal is delayed each time it passes each of the numerous buffers 100.

SUMMARY OF THE INVENTION

It is therefore an object of the present invention to provide a semiconductor device and a method for manufacturing the same that solves the problems of time delay in turning on and off circuits that fix potentials of signal input wirings and blunting of waveforms, lowers the chip-size dependence of the disposed buffer, and prevent increase in the area occupied by the required circuits.

A semiconductor device in accordance with one embodiment of the present invention includes a peripheral circuit region and a central circuit region in which a plurality of logic circuits are formed. The peripheral circuit region includes at least a first cell having a test terminal, N number of second cells and a plurality of third cells. Each of N number of the second cells is connected to one of a plurality of signal terminals that input and/or output signals. Each of the plurality of third cells has one of power source terminals. Among N number of the second cells, n number of the second cells (n<N) have input signal wirings in which signals are inputted through the signal terminals, and have potential fixing circuits that fix the potential on the input signal wirings. Each of n number of the potential fixing circuits has a control terminal. The test terminal connects to a control signal wiring that is provided along the peripheral circuit region. The control signal wiring connects to the control terminals of the potential fixing circuits. The control terminals are provided with a logic that turns on the potential fixing circuits during normal operation, to thereby fix the potential of the input signal wirings. When a signal is inputted in the test terminal, the potential fixing circuits turn off. As a result, the input signal wirings are placed in a floating state, and thus the input leak test can be accurately conducted. A plurality of serially connected buffers are provided in the control signal wiring. The plurality of buffers are disposed in a plurality of third cells, but not disposed in the N number of the second cells.

In accordance with one embodiment of the present invention, the third cell having the power source terminal and a power source wiring connected thereto has a larger empty space than that of the second cell having an input circuit, an output circuit or an input/output circuit. As a result, the empty space can be used for placing a buffer. In particular, in a master slice type semiconductor device, pre-formed transistors in the third cells can be used to form buffers, and therefore there is no need to provide extra spaces for buffers.

Moreover, the third cells having the power source terminals are generally evenly distributed along the four edges of the semiconductor device. As a result, an appropriate number of buffers can be distributed in the control signal wiring that is formed along the peripheral circuit region, and thus a load such as the wiring capacitance can be born by the distributed buffers. This arrangement can reduce the capacitance of each buffer. Also, waveform of the control signal is rectified by the distributed buffers. In addition, the number of buffers is substantially reduced compared to the second prior art. As a result, the total amount of control signal delays occurred at the buffers is reduced and thus an input leak test can be performed at a higher speed.

The peripheral circuit region may further include fourth cells that have signal terminals that may not be connected to any internal wirings. The fourth cells of this type are typically present in a master slice type semiconductor device, and generally referred to as non-connected cells. Buffers can be placed in the fourth cells because the fourth cells have relatively large empty spaces which can be utilized for placing buffers. Accordingly, there is no need to provide extra spaces for buffers in the peripheral circuit region.

The peripheral circuit region may have four fifth cells respectively disposed in the four corners thereof. The four fifth cells normally do not have signal terminals or power source terminals. In this case, the four fifth cells provide empty spaces, and a buffer can be disposed in at least one of them.

The drivability of the buffer disposed in the fifth cell may preferably be greater than the drivability of the buffer disposed in the other cells other than the fifth cells.

Because the fifth cells are disposed in the corners, where they can have greater layout areas, the drivability of the buffers can be relatively readily increased. As a result, a buffer capability that is comparable to the buffer capability of the second prior art can be attained without increasing the required area therefor.

The power source terminal may be composed of at least a grounding voltage terminal, a first power source voltage terminal that is supplied with a first power source voltage, and a second power source voltage terminal that is supplied with a second power source voltage lower than the first power source voltage. For example, such an arrangement may be implemented in a semiconductor device that is driven by two different power source voltages, for example 3V and 5V. In this case, buffers may preferably be provided in a third cell having a grounding voltage terminal and in a third cell having a first power source voltage terminal, but a buffer may not be provided in a third cell having a second power source voltage terminal. This is because when an input of 5V is provided to a buffer that is driven by an input of 3V, its maximum output is 3V, which results in troubles.

For example, troubles may occur when at least one of the second cells that is supplied with a first power source voltage inverts the logic of a control signal, and there are provided first CMOS inverters that supply the inverted signal to the potential fixing circuits. In such a case, for example, a voltage of 3V is supplied to each of gates of the CMOS inverters that are driven by a voltage of 5V. As a result, a through current flows in the first CMOS inverters. Therefore, in order to supply 5V (the maximum voltage) to each of the gates of the first CMOS inverters, buffers may preferably be provided in the third cells that have first power source voltage terminals that are supplied with the highest voltage.

With this arrangement, even when at least one of the second cells, that is supplied with a second power source voltage, inverts the logic of the control signal that is provided through the buffer disposed in the third cell that has the first power source voltage terminal, and a second CMOS inverter is provided to supply the inverted signal to the potential fix circuit, a through current does not flow in the second CMOS inverter. However, where the first and second power source voltages are, for example 5V and 3V, respectively, a voltage of 5V from the inverter may be shifted down to 3V, and then supplied to each of the gates of the second CMOS inverters.

In accordance with another embodiment of the present invention, a semiconductor device is manufactured by a method including: the first step of forming a substrate defining a peripheral circuit region and a central circuit region and having a plurality of basic cells, each composed of a predetermined number of transistors; the second step of determining the placement of the cells and wirings therefor to be disposed in the peripheral circuit region and the central circuit region; the third step of routing the plurality of transistors on the substrate based on the determined placement and routing; and the fourth step of cutting the substrate into a plurality of semiconductor devices.

In a preferred embodiment of the present invention, the second step may include a plurality of steps. One of the steps includes determining the placement of a first cell having a test terminal, N number of second cells for inputting and/or outputting signals, each connected to a signal terminal, a plurality of third cells, each having a power source terminal, and fourth cells, each having a signal terminal that is not connected to any internal wiring.

Another one of the steps includes disposing, among N number of the second cells, voltage fixing circuits in n (n<N) number of the second cells that have input signal wirings to which signals are inputed through the signal terminals for fixing potentials of the signal input wirings.

Still another one of the steps includes disposing, in the third and fourth cells, buffers to be connected to the control signal wiring that connects to the test terminal and extends along the peripheral circuit region.

In accordance with another embodiment of the present invention, semiconductor devices in accordance with one of the above-described embodiments are manufactured from a master slice.

In the case of a master slice, the second step may preferably include disposing a buffer in at least one of four fifth cells that are disposed in the four corners of the peripheral circuit region. In this case, in the first step, the drivability of transistors disposed in the fifth cells may preferably be greater than the drivability of the transistors disposed in the first through fourth cells.

Other features and advantages of the invention will be apparent from the following detailed description, taken in conjunction with the accompanying drawings which illustrate, by way of example, various features of embodiments of the invention.

PREFERRED EMBODIMENTS

Preferred embodiments of the present invention will be described below with reference to the accompanying drawings.

Figure 1:
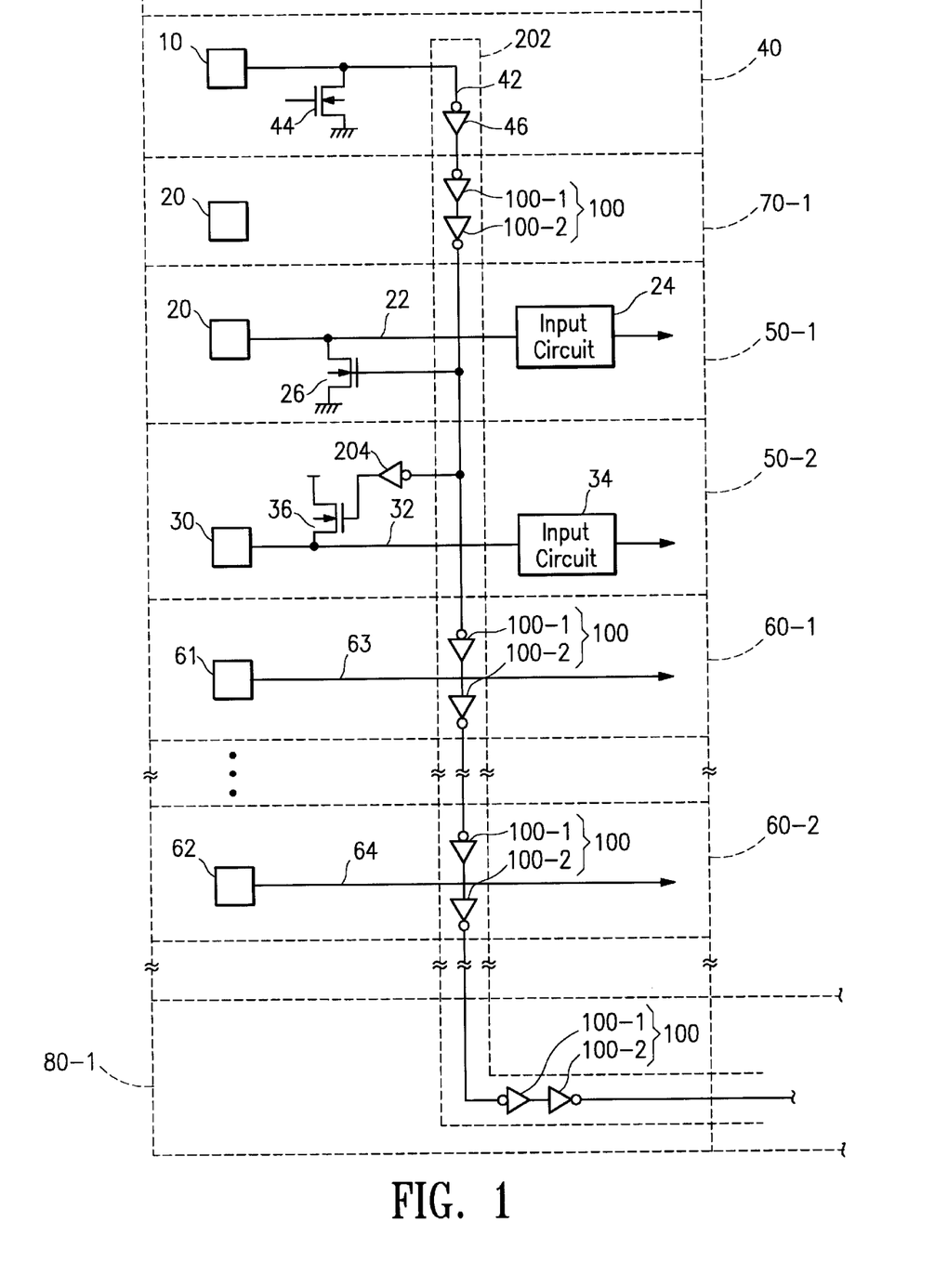
FIG. 1 is a circuit diagram in part of a peripheral circuit region of a semiconductor device in accordance with a first embodiment of the present invention.
Figure 2:
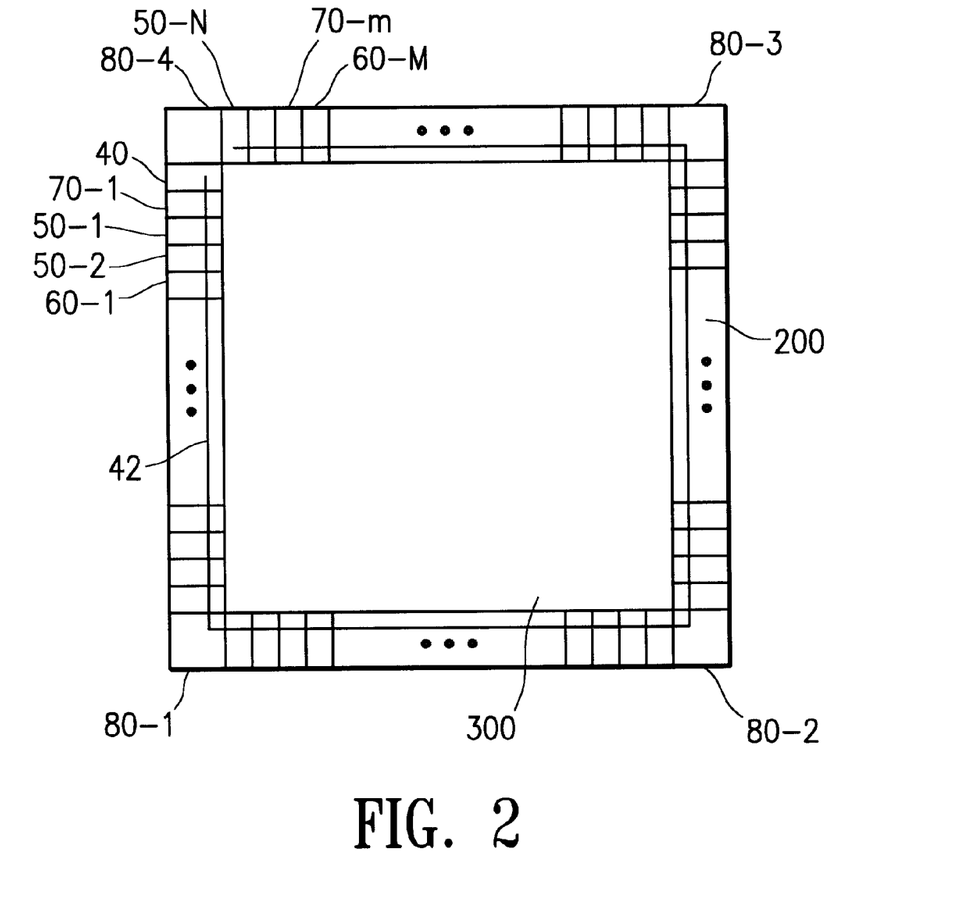
FIG. 2 is a plan view of the entire semiconductor device shown in FIG. 1.

FIG. 1 shows in part a peripheral circuit region of a semiconductor device in accordance with a first embodiment of the present invention. FIG. 2 shows a plan view of the semiconductor device.

For example, the semiconductor device is a master slice type semiconductor device that is manufactured from a master slice having pre-formed transistors. The transistors are wired and then the master slice is cut into small semiconductor devices. The semiconductor device shown in FIG. 2 has a peripheral circuit region 200 and a central circuit region 300.

Many highly integrated MIS transistors, for example MOS transistors of the same size are mounted in the central circuit region 300. The MOS transistors are wired to provide a variety of logic cells.

The peripheral circuit region 200 provides functions, such as a function to input and output signals through signal terminals, and a function to input a power source voltage through a power source terminal. Accordingly, the peripheral circuit region 200 is designed in consideration of its drivability. Circuits that are disposed in the peripheral circuit region 200 are required to have enough drivability against the capacitance of external wirings such as wire bonding. The circuits also need to have protective function against electrostatic from the external terminals.

As shown in FIG. 2, the peripheral circuit region 200 has a test cell 40 (first cell), N number of input/output cells 50-1 through 50-N (second cells), M number of power source cells 60-1 through 60-M (third cells), and m number of non-connected cells 70-1 through 70-m (fourth cells) and four corner cells 80-1 through 80-4 provided at four corners.

Also, the peripheral circuit region 200 is provided with an inverter circuits line 202 that starts from the test cell 40 and extends generally along the entire peripheral circuit region to an N-th input/output cell 50-N.

As shown in FIG. 1, the inverter circuits line 202 refers to an area in which a control signal wiring 42, which starts from the test cell 40, is disposed. An inverter 46 within the test cell 40 is also formed in the inverter circuits line 202.

As shown in FIG. 1, a plurality of buffers 100, each composed of, for example, two serially connected inverters 100-1 and 100-2, are disposed in the control signal wiring 42 within the inverter circuit line 202.

In accordance with the first embodiment, cells used for disposing the buffers 100 are selected. In accordance with the first embodiment, the buffers 100 are provided in all of M number of the power source cells 60-1 through 60-M, all of m number of non-connected cells 70-1 through 70-m, and three of the four corner cells 80-1 through 80-3. Accordingly, the total number of the buffers 100 is (M+m+3). On the other hand, no buffers are provided in N number of the input/output cells 50-1 through 50-N.

Referring to FIG. 1, the test cell 40 (i.e., first cell) 40 includes a test terminal 10, a control signal wiring 42 connected to the test terminal 10, an N-type MOS transistor 44 that always maintains the potential on the control signal wiring 42 at level "L", and an inverter 46 provided in the control signal wiring 42. The test cell 40 has the same structure as the one shown in FIG. 9. The control signal wiring 42 is disposed along the inverter circuits line 202 and extends along generally the entire periphery of the peripheral circuit region of the semiconductor device, as shown in FIG. 2.

The input cells 50-1 through 50-N (i.e., second cells) generally refer to input cells, input/output cells and output cells. They include n (n<N) number of input cells or input/output cells, and (N-n) number of output cells.

FIG. 1 shows an input cell 50-1 and 50-2 as the second cells.

The input cell 50-1 shown in FIG. 1 has a structure similar to the one shown in FIG. 9 to the extent that it includes an input terminal 20, an input signal wiring 22, an input circuit 24, and a pull-down N-type MOS transistor 26. However, the input cell 50-1 shown in FIG. 1 does not have a buffer 100. The input circuit 24 may preferably be formed by, for example, two serially connected inverters.

The input cell 50-2 shown in FIG. 1 also has a structure similar to the one shown in FIG. 9 to the extent that it includes an input terminal 30, an input signal wiring 32, an input circuit 34, and a pull-up P-type MOS transistor 36. The input cell 50-2 shown in FIG. 1 includes an inverter 204 that inverts the logic of a signal on the control signal wiring 42. An output of the inverter 204 is supplied to a gate of the pull-up P-type MOS transistor 36. However, the input cell 50-2 shown in FIG. 1 does not have a buffer 100. The input circuit 34 may preferably be formed by, for example, two serially connected inverters.

It is noted that output cells and input/output cells (although they are not shown in FIG. 1) are not provided with buffers 100.

The power source cell 60-1 shown in FIG. 1 includes a power source voltage (VDD) terminal 61, a power source voltage supply wiring 63 connected to the power source voltage terminal 61, and a buffer 100 disposed in the inverter circuit line 202.

The power source cell 60-2 shown in FIG. 1 includes a grounding voltage (VSS) terminal 62, a grounding voltage supply wiring 64 connected to the grounding voltage terminal 62, and a buffer 100 disposed in the inverter circuits line 202.

The non-connected cell 70-1 shown in FIG. 1 includes an input terminal 20, but does not have any wiring connected to the input terminal 20. A buffer 100 is disposed in the inverter circuits line 202 in the non-connected cell 70-1.

The corner cell 80-1 shown in FIG. 1 does not have an input terminal 20, 30, an input/output terminal 210 or a voltage terminal 61, 62. Only a buffer 100 is provided in the inverter circuits line 202. The corner cell 80-1 has a larger area than that of the other cells, as shown in FIG. 2. As a result, the drivability of the buffer 100 can be readily made greater than that of the other cells.

In accordance with the first embodiment, no buffers 100 are provided in the input/output cells 50-1 through 50-N in which the pull-down or pull-up transistors 26, 36, the input circuits 24, 34, and the logic circuits such as output circuits or input/output circuits are formed. As a result, all of the transistors formed on the master slice substrate can be allocated to the above-described logic circuits. In other words, in the input/output cells 50-1 through 50-N, the transistors formed in the inverter circuits line 202 can be allocated for constructing the above-described logic cells.

On the other hand, unlike the input/output cells 50-1 through 50-N, buffers 100 are provided in all of M number of the power source cells 60-1 through 60-M, all of m number of non-connected cells 70-1 through 70-m and only three of the four corner cells 80-1 through 80-3, wherein no logic cells are formed. The buffers 100 can be composed of transistors formed in these cells. Therefore, the area does not have to be increased to form the buffers 100.

Let us assume that one chip of a master slice has, for example, 208 terminals, and a user needs 160 terminals. In this case, the number m of the non-connected cells is 208−160=48. The 160 terminals required by the user include the power source voltage terminals 61 and the grounding voltage terminals 62. Assuming that each two of the power source voltage terminals 61 and the grounding voltage terminals 62 are to be provided in each of the four edges, the number M of the power source cells is 4 (edges)×2

(terminals)×2 (types)=16. Accordingly, the total number of the buffers 100 is (M+m+3)=48+16+3=67. Sixty seven (67) cells in which the 67 buffers 100 are are generally evenly distributed along the four edges when the placement and routing determination step is performed by the automatic placement and routing apparatus. Moreover, the distributed cells having the buffers 100 can be arranged in each of the edges in such a manner that they are not successively disposed.

Figure 3:
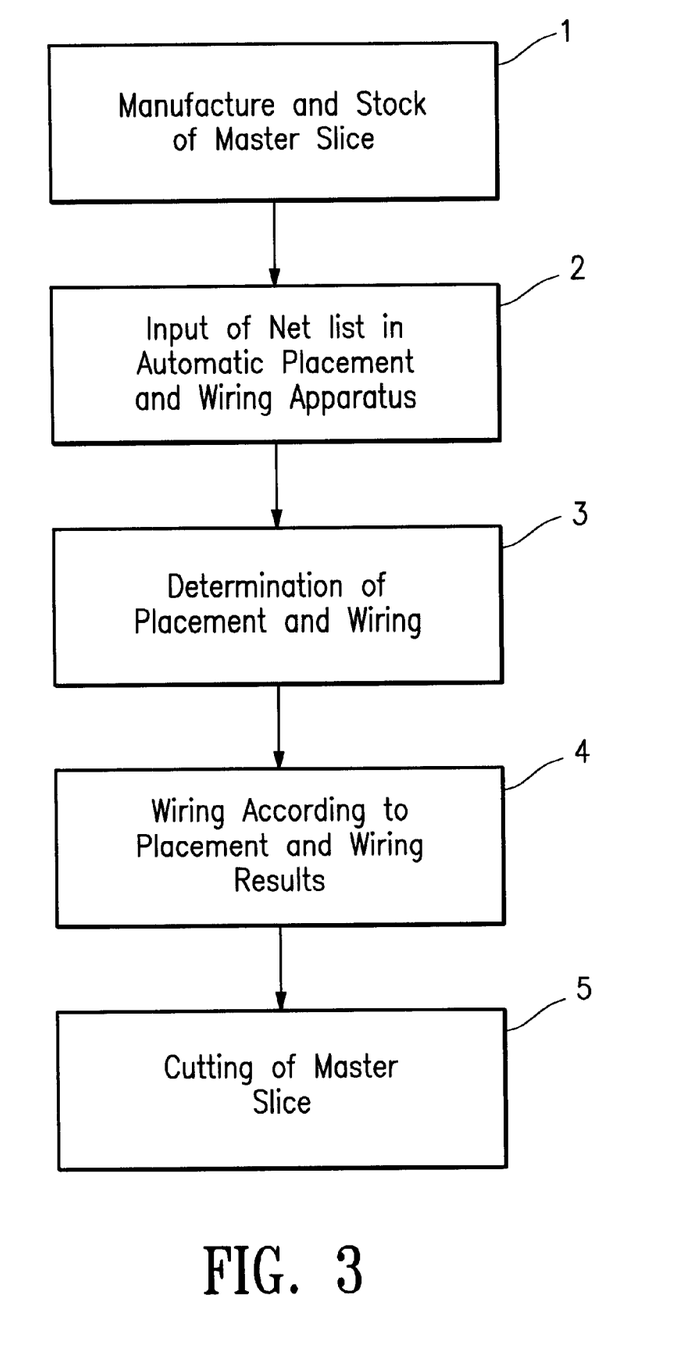
FIG. 3 is a flow chart of the steps for manufacturing the semiconductor device shown in FIG. 1.

Master slice type semiconductor devices are manufactured by steps shown in FIG. 3. Initially, many master slices are manufactured and stored (step 1). Each of them has numerous basic cells, each cell being composed of a plurality of transistors, formed in a peripheral circuit region 100 and a central circuit region, as shown in FIG. 1. In this step, transistors in corner cells 80-1 through 80-4 disposed in the four corners can be made to have sizes that provide greater drivability than other transistors. Next, a net list, that defines connections between the basic cells, is inputted in an automatic placement and routing apparatus that has a pre-registered library (step 2). The library may contain various conditions, for example, for the placement of buffers 100, and the like. Then, the automatic placement and routing apparatus determines placement of logic cells in the central circuit region 300 and placement of the above-described cells in the peripheral circuit region 200, and internal routing of the basic cells and routing between the basic cells to attain the above-described dispositions (step 3). Then, the routing is conducted and a protection film is provided on the master slice (step 4). The master slice is cut into small pieces to provide semiconductor devices (step 5).

With the same master slices, the definitions in the net list used in step 2 shown in FIG. 3 can be changed to manufacture a variety of different semiconductor devices that meet the user's requirements. In particular, the above-described definitions for the cells in which the buffers 100 are disposed may be registered in the library in advance, such that the placement and routing of the buffers 100 can be determined by the automatic placement and routing apparatus according to the net list.

As a result of the placement of the buffers 100 in accordance with the first embodiment, the following effects are further achieved.

Load capacitance, such as wiring capacitance of the control signal wiring 42 and gate capacitance of the pull-up and pull-down transistors, is divided and bone by the plurality of the buffers 100 that are distributed and disposed in the control signal wiring 42. This arrangement reduces the chip-size dependence of the capacitance of the buffer 100. In other words, for example, the buffer 100 disposed in the non-connected cell 70-1 of FIG. 1 bears only the wiring capacitance of the control signal wiring 42 up to the next buffer 100 (the buffer 100 in the power source cell 60-1), and the capacitance up to the gates of the transistors 26 and 36 in the input cells 50-1 and 50-2. Therefore, devices of great capacitance, that are required in the first prior art, are not required.

Also, since a substantially great number of the buffers 100 are provided in the control signal wiring 42, and the waveform of a control signal is rectified at each of the buffers 100, correct logics can be provided to the gates of the pull-up or pull-down transistors.

Moreover, in accordance with the first embodiment of the present invention, the number of buffers disposed in the control signal wiring 42 is greatly reduced, compared to the second prior art. Accordingly, a total of delays of a control signal occurred at the buffers 100 is substantially reduced, and therefore an input leak test can be conducted at high speed.

The effects of the first embodiment are compared to those of the first prior art and the second prior art. The comparison results are shown in Table 1 below.

TABLE 1

|  | Embodiment | First Prior Art | Second Prior Art |
| --- | --- | --- | --- |
| Division of capacitance by buffers | Possible | Impossible | Possible |
| Waveform rectification by buffers | Possible | Impossible | Possible |
| Chip-size dependence of buffer capacitance | No | Yes | No |
| Shortened input leak test | Possible | Impossible | Impossible |
| Increased area for buffers | No | No | Yes |

Figure 4:
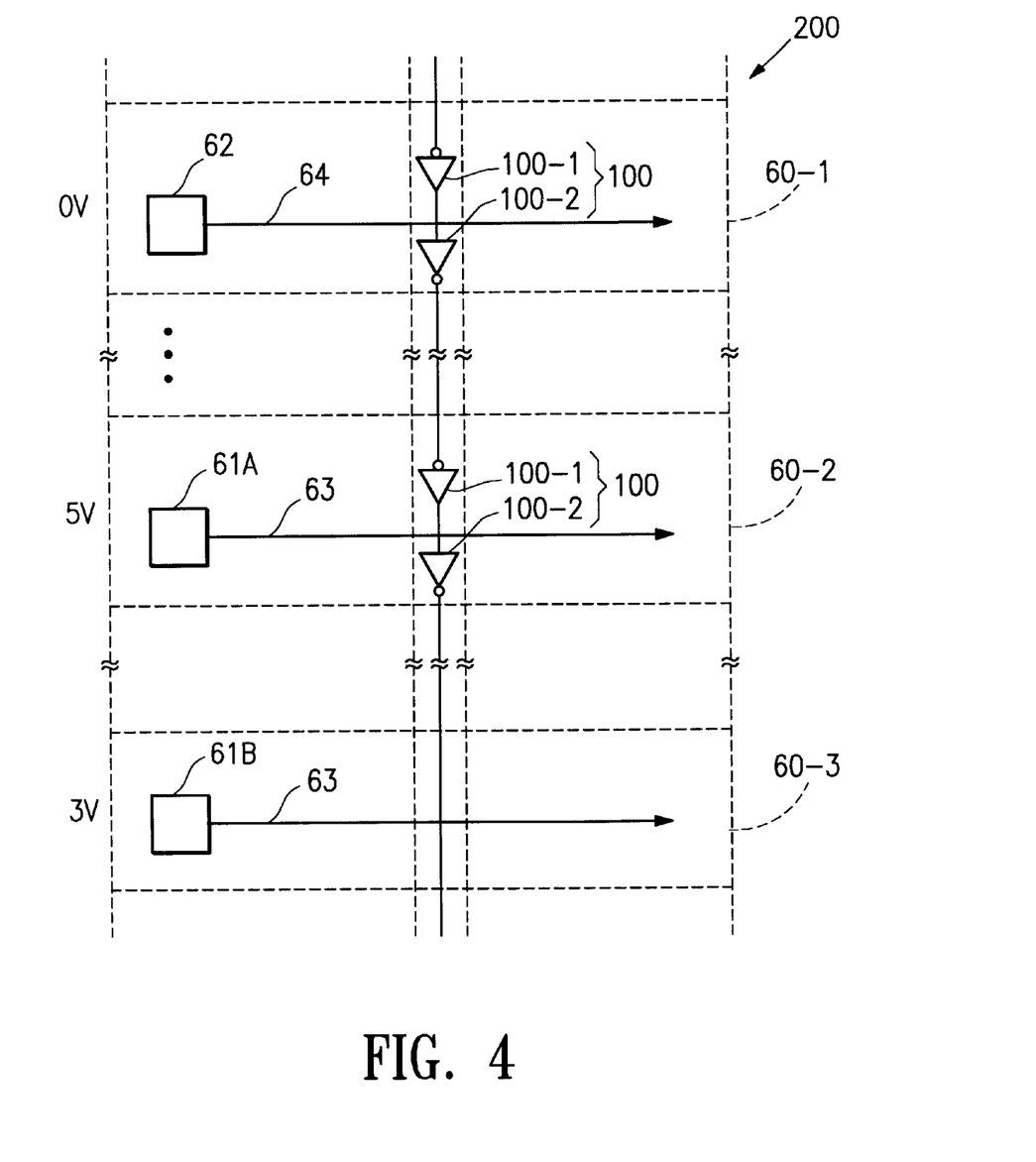
FIG. 4 is a circuit diagram in part of a peripheral circuit region of a semiconductor device in accordance with a second embodiment of the present invention.

FIG. 4 shows, in part, a peripheral circuit region 200 of a semiconductor device. The semiconductor device includes a first power source voltage terminal 61A that receives an input voltage of 5V, for example, and a second power source voltage terminal 61 that receives an input voltage of 3V, for example, instead of the power source voltage terminal 61. In this embodiment, first logic cells driven by the voltage of 5V and second logic cells driven by the voltage of 3V are disposed in the central circuit region 300. Also, depending on the requirements, level shifters may be provided to shift the signal level between the first logic cells and the second logic cells. In one embodiment, the central circuit region 300 may be provided with logic cells, all of which are driven by only the voltage of 3V or the voltage of 5V. For example, all of the logic cells in the central circuit region 300 may be driven by 3V to thereby reduce power consumption, and the peripheral circuit region 200 may be provided with two types of input/output circuits, namely, a 3V type and a 5V type in order to provide interface with external devices.

When a plurality of power source voltage terminals and the grounding voltage terminal 62 are provided, buffers 100 are provided in (among the power source cells shown in FIG. 4) the power source cell 60-1 that has the grounding voltage terminal 62 and in a power source cell in which a highest voltage is supplied, i.e., the power source cell 60-2 that has the first power source voltage terminal 61A. The power source cell 60-3 that has the second power source voltage terminal 61B is not provided with a buffer 100.

If a buffer 100 is provided in the power source cell 60-3, the following problems would occur. For example, referring to FIG. 5, a buffer 100 is provided in the power source cell 60-3. A control signal from the buffer 100 is supplied to a gate of the pull-up P-type MOS transistor 36 through an inverter 204 in the 5V type input cell 50-2.

Figure 5:
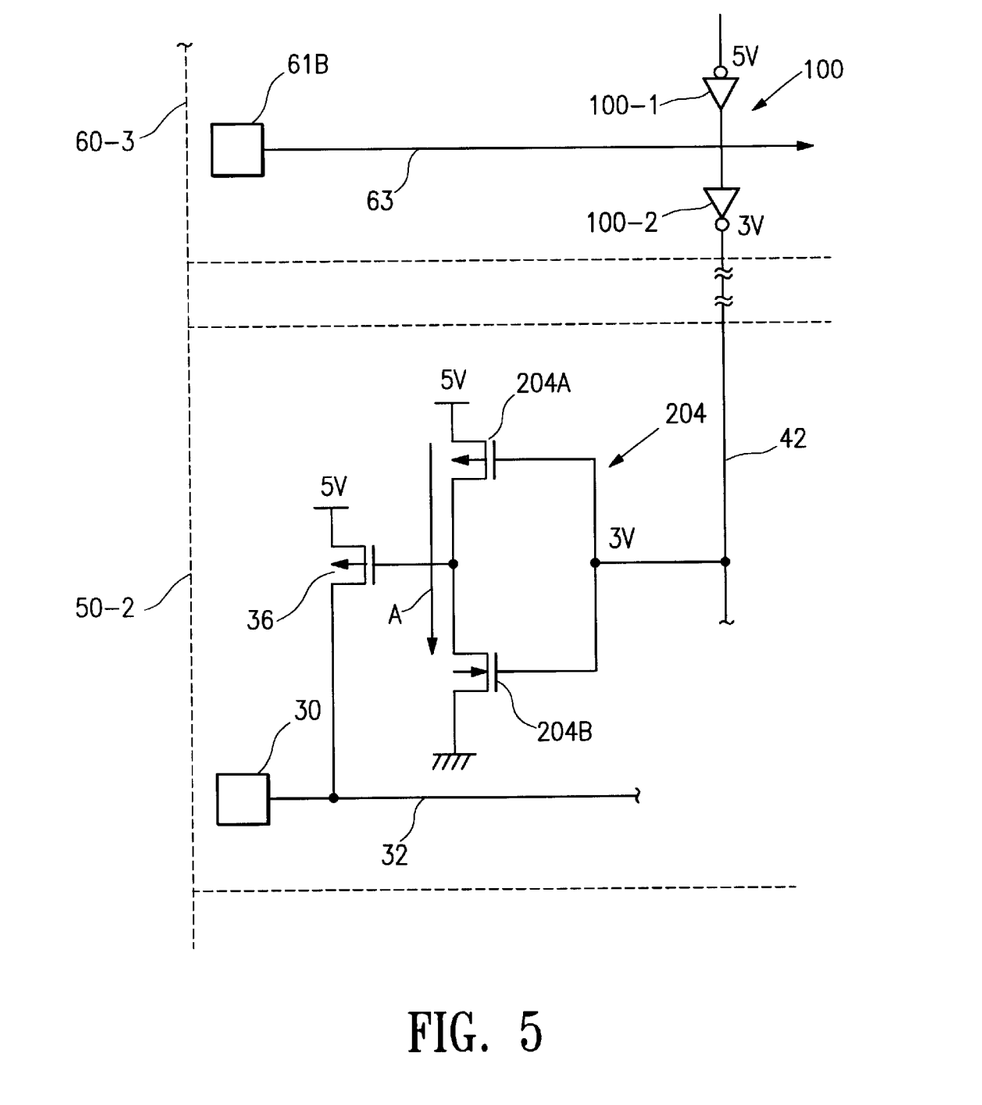
FIG. 5 is a circuit diagram illustrated for describing the problem in which a through current flows in a 5V type input cell if a buffer is provided in a 3V type input cell.

In this case, the input to the buffer 100 is at 5V, but an output therefrom is at 3V. As a result, the voltage of 3V is supplied to gates of the P-type MOS transistor 204A and the N-type MOS transistor 204B that form the inverter (first CMOS inverter) 204. However, since the inverter 204 is provided in the 5V type input cell 50-2, a voltage of 5V is supplied to a source of the P-type MOS transistor 204A.

As a result, the P-type MOS transistor 204A does not completely turn off, with the result that a through current (indicated by an arrow A in FIG. 5) flows. The through current increases the power consumption of the semiconductor device.

In contrast, when a buffer 100 is provided in the 5V type power source cell, an input to the buffer 100 and an output therefrom are at 5V, and therefore the above-described problems do not occur.

Figure 6:
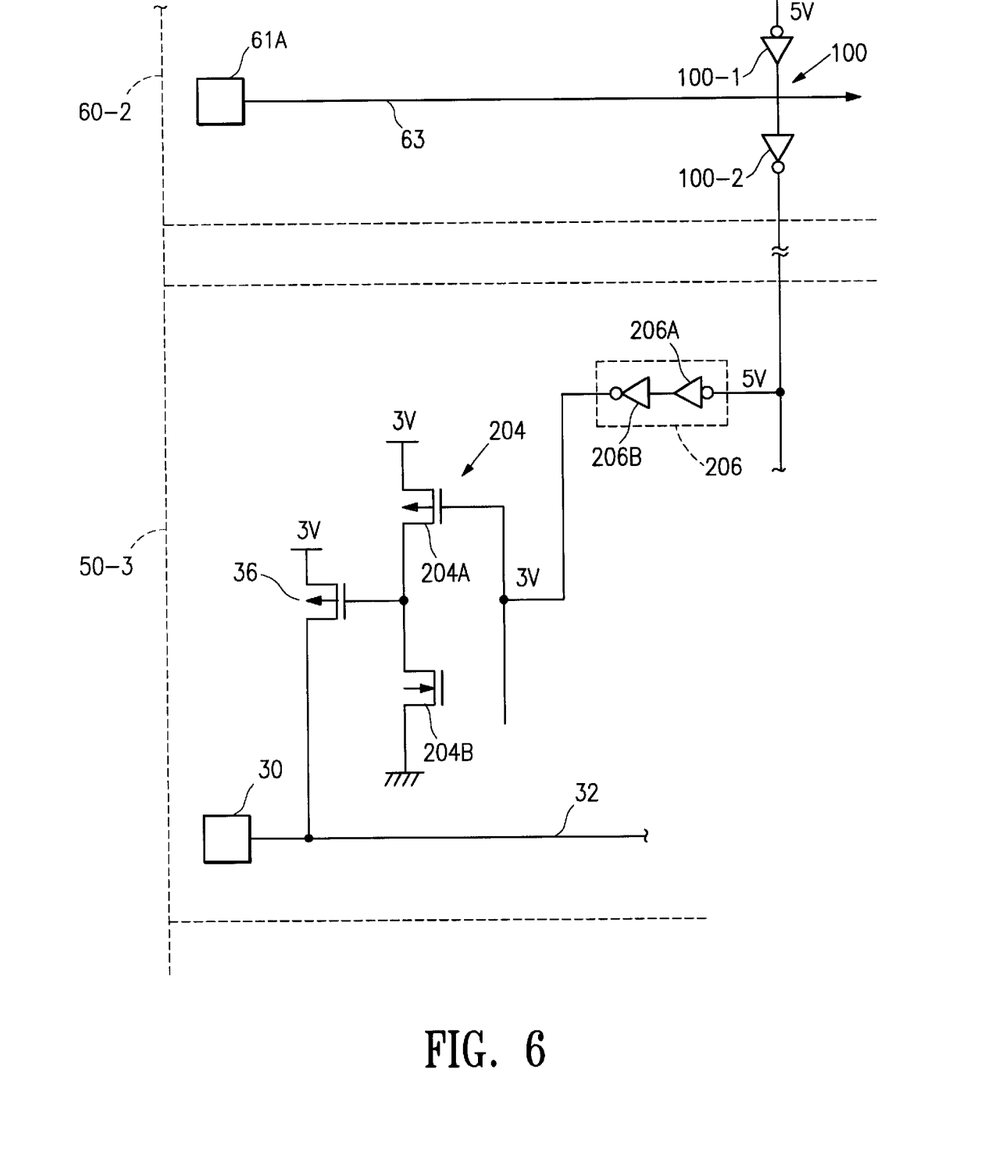
FIG. 6 is a circuit diagram illustrated for describing that a through current does not flow in a 3V type input cell when a buffer is provided in a 5V type input cell.

Referring to FIG. 6, a buffer 100 is provided in the power source cell 60-2 that has the first power source voltage terminal 61A in which a voltage of 5V is supplied. A control signal from the buffer 100 is supplied to a gate of the pull-up P-type MOS transistor 36 through an inverter (second CMOS inverter) 204 in the 3V type input cell 50-3. As shown in FIG. 6, a level shifter 206 composed of two inverters 206A and 206B is provided to shift the voltage from 5V to 3V. The level shifted voltage is supplied to gates of the P-type MOS transistor and the N-type MOS transistor 204A and 204B that form the inverter 204. When the voltage of 5V is supplied to the gate of the 3V type inverter 204, a through current does not flow, unlike the one shown in FIG. 5.

The present invention is not limited to the embodiments described above, and various modifications thereof are possible within the scope of the subject matter of the present invention.

For example, the present invention is applied to master slice type semiconductor devices in the above-described embodiments. However, the present invention is also applicable to other semiconductor devices such as custom ICs. The custom ICs may not have non-connected cells. Buffers can be provided in corner cells only when terminals are not provided therein. In such a case, the provision of buffers is not limited to three corner cells as in the above-described embodiments. If the test cell 40 is provided at a location different than the one shown FIG. 2, buffers 100 may be provided in all of the four corner cells.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
    a peripheral circuit region and a central circuit region having a plurality of logic circuits formed therein;
    the peripheral circuit region comprising:
        a first cell having a test terminal;
        N number of second cells that input and/or output signals, each having one of a plurality of signal terminals;
        a plurality of third cells, each having one of a plurality of power source terminals, wherein, among N number of the second cells, n (n<N) number of the second cells have input signal wirings coupled to the signal terminals, and potential fixing circuits that fix the potential on the input signal wirings, each of n number of the potential fixing circuits having one of a plurality of control terminals;
        a control signal wiring extending along the peripheral circuit region and connecting to the test terminal, the control signal wiring connecting to the control terminals of the potential fixing circuits, wherein the control terminals are provided with a logic that turns on the potential fixing circuits during normal operation, and when a signal is inputted in the test terminal, the potential fixing circuits turn off; and
        a plurality of serially connected buffers coupled to the control signal wiring, wherein the plurality of serially connected buffers are disposed in the plurality of the third cells, but not disposed in N number of the second cells.

2. A semiconductor device according to claim 1, wherein the peripheral circuit region further includes fourth cells, each of the fourth cells having a non-connected signal terminal and at least one buffer coupled to the control signal wiring.

3. A semiconductor device according to claim 1 or claim 2, wherein the peripheral circuit region defines four corners and further includes four fifth cells disposed in the four corners, the four fifth cells do not have the signal terminals or the power source terminals, and wherein at least one of the four fifth cells has a buffer couple to the control signal wiring.

4. A semiconductor device according to claim 3, wherein the buffer provided in the fifth cell has a drivability greater than a drivability of each of the buffers disposed in the cells other than the fifth cells.

5. A semiconductor device according to claim 1, wherein the power source terminals include at least grounding voltage terminals, first power source voltage terminals that are supplied with a first power source voltage and second power source voltage terminals that are supplied with a second power source voltage lower than the first power source voltage, wherein the buffers are provided in the third cells having the grounding voltage terminals and in the third cell having the first power source voltage terminals, and the buffers are not provided in the third cells having the second power source voltage terminals.

6. A semiconductor device according to claim 5, wherein at least one of the second cells that are supplied with the first power source voltage includes a first CMOS inverter that inverts a logic of the control signal inputted through the buffer disposed in the third cell having the first power source voltage terminal, and supplies the inverted signal to the potential fix circuit.

7. A semiconductor device according to claim 5, wherein at least one of the second cells that are supplied with the second power source voltage includes a second CMOS inverter that inverts a logic of the control signal inputted through the buffer disposed in the third cell having the first power source voltage terminal, and supplies the inverted signal to the potential fix circuit.

8. A semiconductor device according to claim 5, wherein at least one of the second cells that are supplied with the second power source voltage includes a level shifter that shifts a level of the control signal inputted through the buffer disposed in the third cell having the first power source voltage terminal to a level matching with the second power source voltage, and an output from the level shifter is supplied to a gate of each of the second CMOS inverters.

* * * * *